US010342154B2

(12) United States Patent
Kai

(10) Patent No.: US 10,342,154 B2
(45) Date of Patent: Jul. 2, 2019

(54) POWER SUPPLY APPARATUS

(71) Applicant: HONDA MOTOR CO., LTD., Tokyo (JP)

(72) Inventor: Masashi Kai, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/907,788

(22) Filed: Feb. 28, 2018

(65) Prior Publication Data

US 2018/0270980 A1 Sep. 20, 2018

(30) Foreign Application Priority Data

Mar. 14, 2017 (JP) .................. 2017-048098

(51) Int. Cl.
| | |
|---|---|
| H05K 5/00 | (2006.01) |
| H05K 7/00 | (2006.01) |
| H05K 7/14 | (2006.01) |
| H05K 5/02 | (2006.01) |
| H01M 2/10 | (2006.01) |
| H02J 7/00 | (2006.01) |
| F02B 63/04 | (2006.01) |
| H01M 10/42 | (2006.01) |
| H02M 7/00 | (2006.01) |

(52) U.S. Cl.
CPC ........ H05K 7/1432 (2013.01); H01M 2/1016 (2013.01); H02J 7/0042 (2013.01); H05K 5/0247 (2013.01); *F02B 63/04* (2013.01); *F02B 63/048* (2013.01); *H01M 10/425* (2013.01); *H01M 2220/30* (2013.01); *H02M 7/003* (2013.01)

(58) Field of Classification Search
CPC ...................................................... H05K 5/00
See application file for complete search history.

(56) References Cited

U.S. PATENT DOCUMENTS

| | | | | | |
|---|---|---|---|---|---|
| 6,059,386 | A | * | 5/2000 | Yu ........................... | G06F 1/181 |
| | | | | | 220/4.32 |
| 6,373,692 | B1 | * | 4/2002 | Cheng ..................... | G06F 1/181 |
| | | | | | 220/4.02 |
| 2001/0027066 | A1 | * | 10/2001 | Loh ....................... | H01R 13/514 |
| | | | | | 439/701 |

FOREIGN PATENT DOCUMENTS

JP 6069088 1/2017

* cited by examiner

*Primary Examiner* — Jerry Wu
(74) *Attorney, Agent, or Firm* — Rankin, Hill & Clark LLP

(57) ABSTRACT

A power supply apparatus is provided in which a cover can be easily attached to a housing without using attachment jigs. Provided is a power supply apparatus that holds a battery and an inverter in a housing, wherein a groove portion for drainage is formed on at least an upper part of an opening portion of the housing, a cover that covers the opening portion is arranged on the opening portion, and the cover includes at least one first fixing claw inserted into the groove portion and at least one second fixing claw that presses the groove portion from an outside.

12 Claims, 7 Drawing Sheets

POWER SUPPLY APPARATUS

INCORPORATION BY REFERENCE

The present application claims priority under 35 U.S.C. § 119 to Japanese Patent Application No. 2017-048098 filed on Mar. 14, 2017. The content of the application is incorporated herein by reference in its entirety.

BACKGROUND OF THE INVENTION

Field of the Invention

The present invention relates to a power supply apparatus.

Description of the Related Art

Conventionally, a power supply apparatus based on an engine is provided to assist outdoor activities, such as camping, or activities during blackout.

An example of this type of power supply apparatus includes an apparatus that holds internal apparatuses, such as a battery and an inverter, in a housing. The housing is provided with, for example, an opening for performing maintenance, and a cover that covers the opening is fixed to the housing by fastening parts, such as fixing bolts (for example, see Japanese Patent No. 6069088).

However, when the cover is fixed to the housing by fastening parts, such as fixing bolts, the number of parts, such as fixing bolts, increases, and assembly jigs are used to attach the cover to the housing. Therefore, the attachment work is complicated, and there is still a room for improvement.

The present invention has been made in view of the circumstances, and an object of the present invention is to provide a power supply apparatus in which a cover can be easily attached to a housing without using assembly jigs.

SUMMARY OF THE INVENTION

To attain the object, the present invention provides a power supply apparatus that holds a battery and an inverter in a housing, wherein a groove portion for drainage is formed on at least an upper part of an opening portion of the housing, a cover that covers the opening portion is arranged on the opening portion, and the cover includes at least one first fixing claw inserted into the groove portion and at least one second fixing claw that presses the groove portion from an outside.

In an aspect of the present invention, the second fixing claw includes a pressing portion that presses the groove portion from the outside and a support portion that supports the groove portion from below.

In an aspect of the present invention, a total number of the first fixing claws and the second fixing claws is at least three, and the first fixing claws and the second fixing claws are alternately provided and are provided at positions not overlapping with each other.

In an aspect of the present invention, a positioning portion that can be engaged with a lower part of the cover is further included on a lower part of the opening portion.

In an aspect of the present invention, the positioning portion is provided on at least one part of each of a right half and a left half of the housing.

In an aspect of the present invention, the groove portion is also formed on a side of the housing, and the groove portion formed on the side of the housing comprises an inclined portion inclined from an inside to the outside of the groove portion.

According to the present invention, the first fixing claw is inserted into the groove portion, and the second fixing claw presses the groove portion from the outside. The first fixing claw and the second fixing claw fix the housing and the cover through the groove portion. Therefore, the power supply apparatus can be provided in which the housing and the cover can be easily fixed without using assembly jigs.

DETAILED DESCRIPTION OF THE PREFERRED EMBODIMENT

An embodiment of the present invention will now be described with reference to the drawings.

Figure 1:
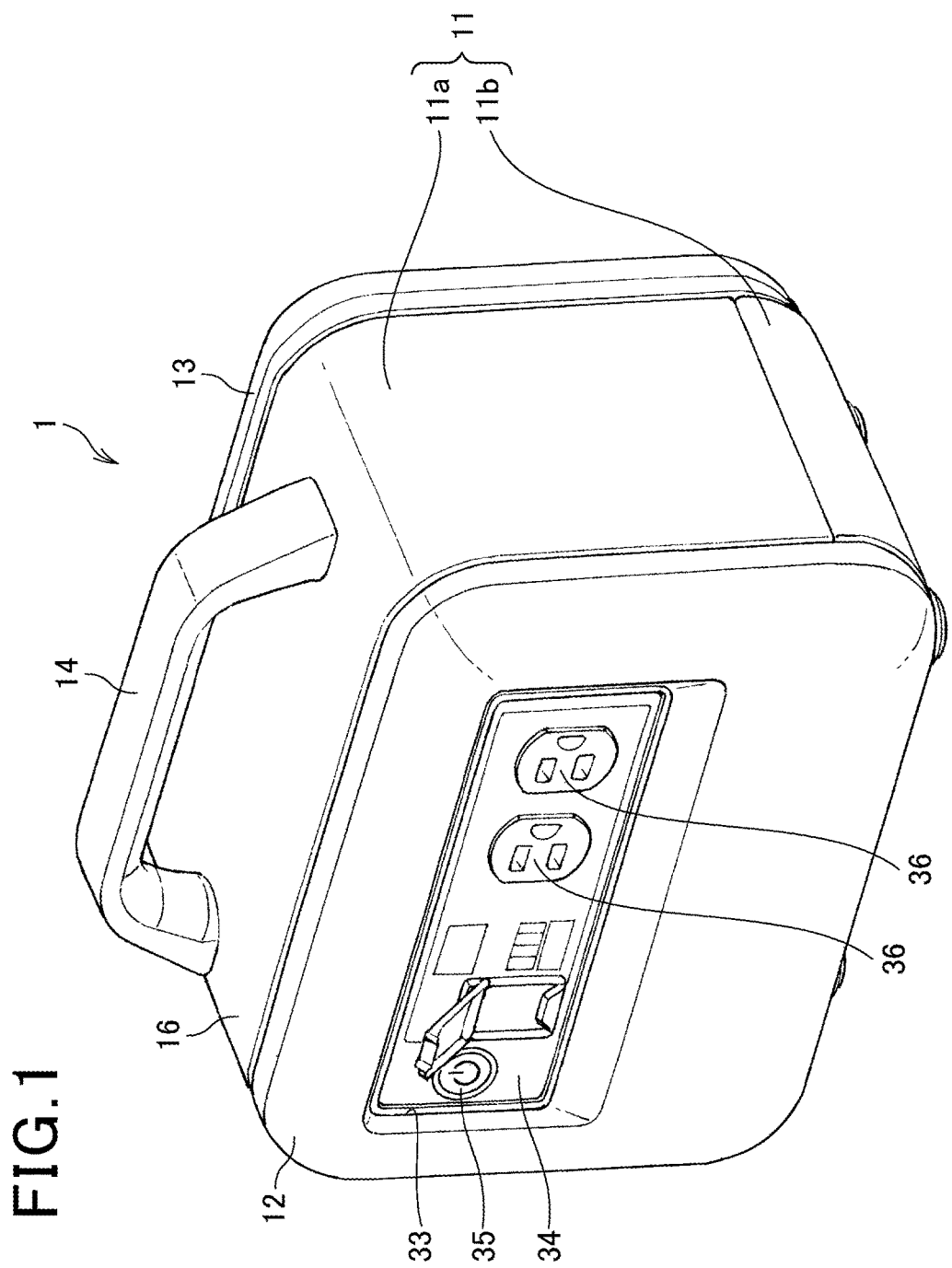
FIG. 1 is a perspective view showing a whole picture of a power supply apparatus according to an embodiment of the present invention.
Figure 2:
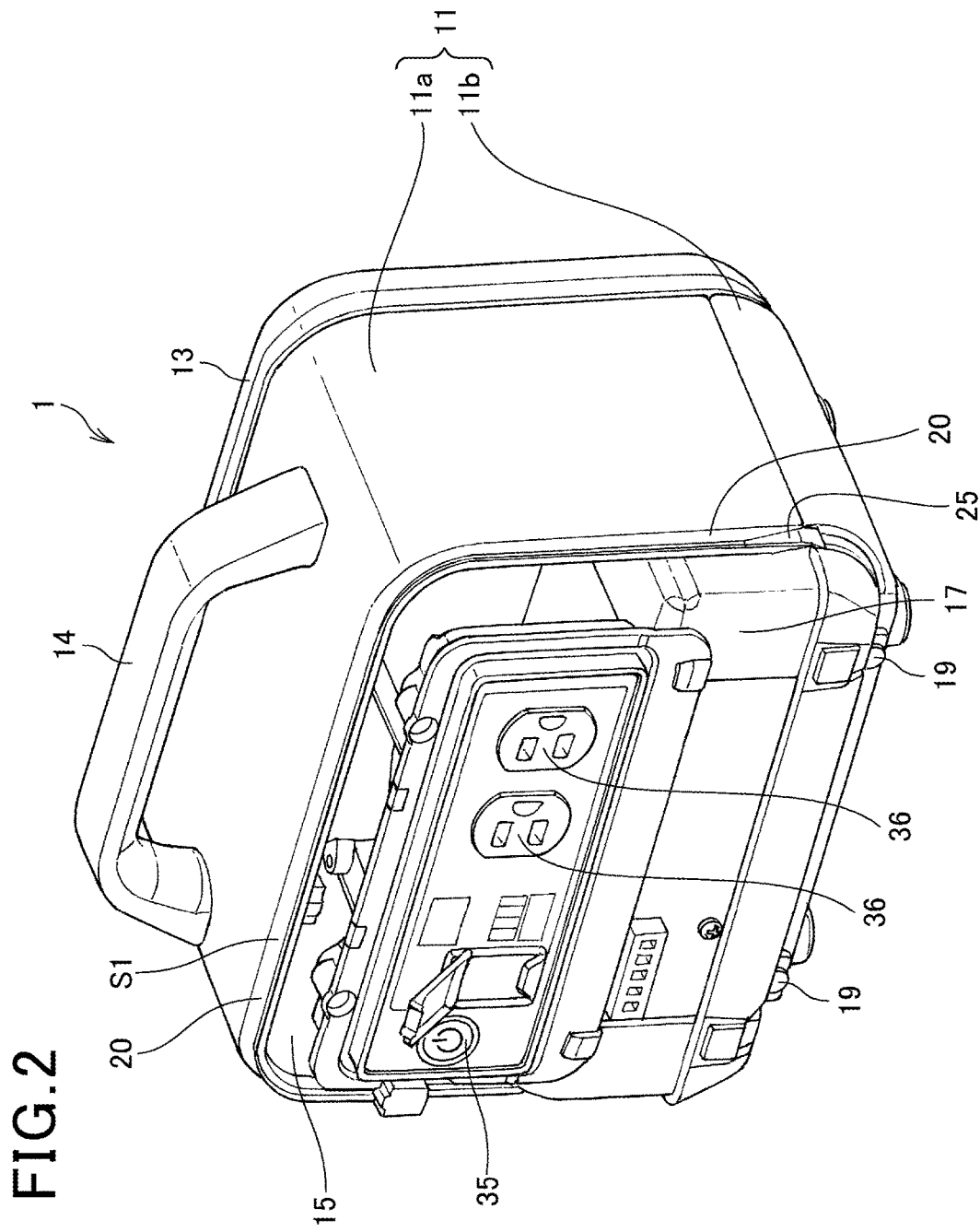
FIG. 2 is a perspective view of the power supply apparatus with a front cover removed.
Figure 3:
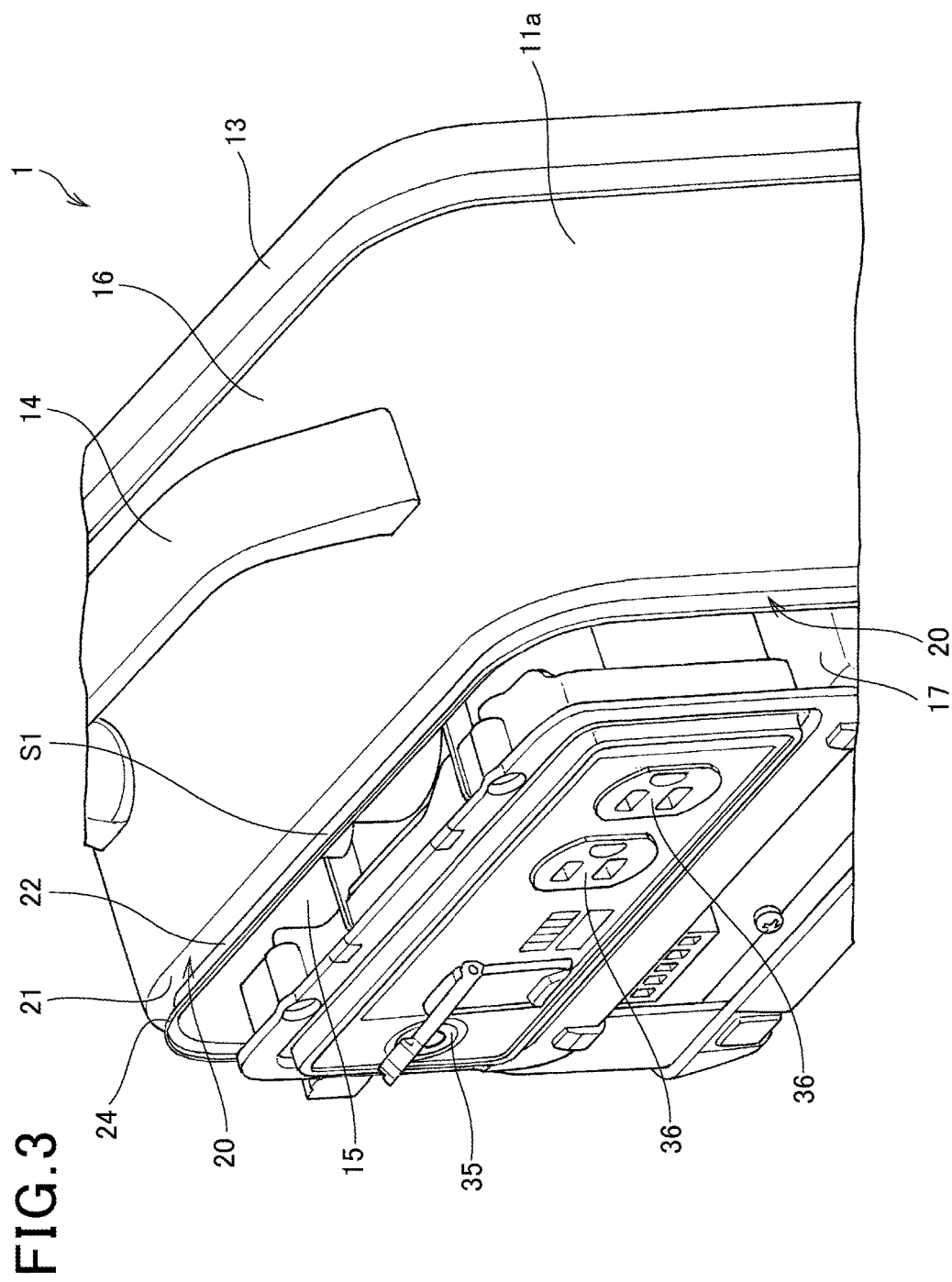
FIG. 3 is a perspective view of the power supply apparatus with the front cover removed.
Figure 4:
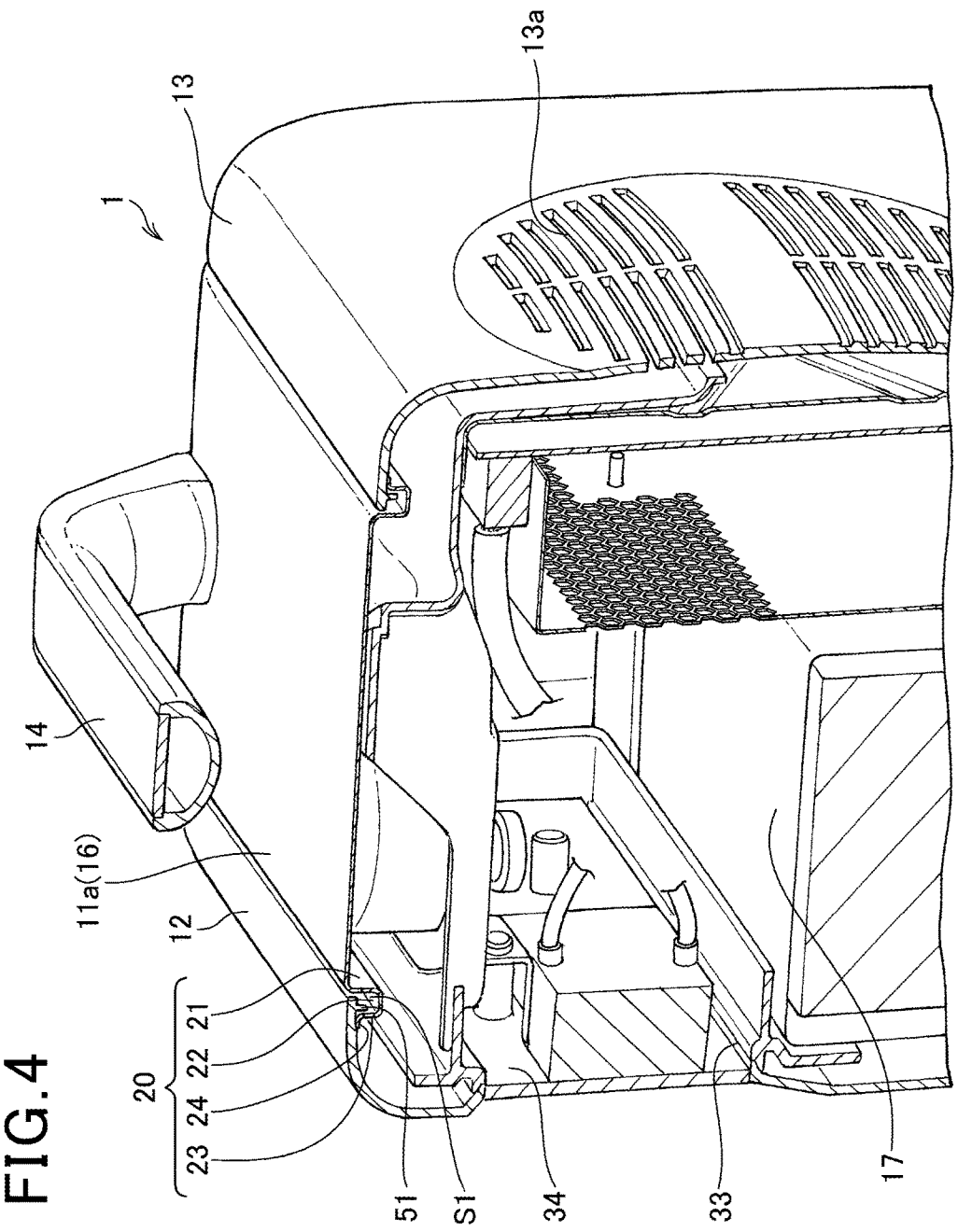
FIG. 4 is a perspective view showing the inside of the power supply apparatus.
Figure 7:
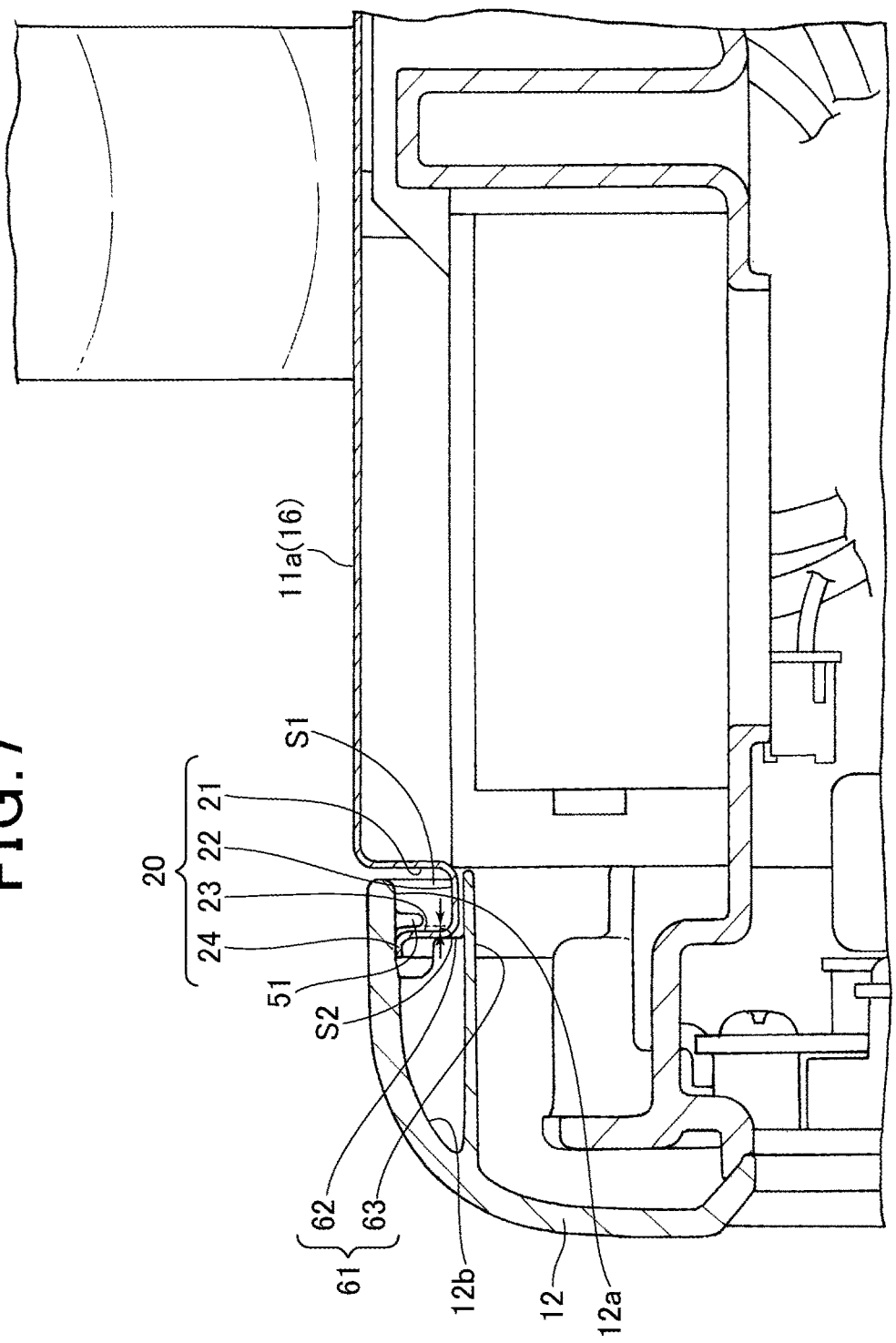
FIG. 7 is a cross-sectional view of the power supply apparatus.

FIG. 1 is a perspective view showing a whole picture of a power supply apparatus 1 according to the embodiment of the present invention. FIGS. 2 and 3 are perspective views of the power supply apparatus 1 with a front cover 12 removed. FIG. 4 is a perspective view showing the inside of the power supply apparatus 1. FIG. 7 is a cross-sectional view of the power supply apparatus 1. Note that in the power supply apparatus 1 shown in FIG. 1, the side provided with the front cover 12 will be defined as a front side, and the side provided with a back cover 13 will be defined as a back side. In front view of the power supply apparatus 1, the height direction will be defined as a longitudinal direction, and a left and right direction will be defined as a lateral direction.

As shown in FIGS. 1 to 4, the power supply apparatus 1 includes: a housing 11 that houses an engine, a battery 17, an inverter, a fuel tank, and the like provided inside; the front cover (cover) 12 that closes an opening portion 15 formed on the front side of the housing 11; the back cover (cover) 13 that closes an opening not shown formed on the back side of the housing 11; and a handle 14 provided on an upper part of the housing 11.

The housing 11 includes: a housing body 11a provided with the handle 14; and an under cover 11b provided on a lower part of the housing body 11a.

The housing 11, the front cover 12, the back cover 13, and the under cover 11b are formed by a resin.

The back cover 13 includes a plurality of slits 13a.

As shown in FIGS. 2 and 3, the housing 11 includes the opening portion 15 on the front side. The opening portion 15 is formed such that four corners are curved in front view. A groove portion 20 for drainage is formed on an upper part of the opening portion 15.

The groove portion 20 is formed throughout the entire upper part of the opening portion 15. The groove portion 20 is formed continuously with both side portions of the opening portion 15 from the upper part of the opening portion 15.

As shown in FIGS. 4 and 7, the groove portion 20 includes: a main wall 21 continuous with the housing body 11a; a groove bottom portion 22; a front wall 23 rising up from a front side of the groove bottom portion 22; and a cover contact portion 24 extending to the front side from an upper part of the front wall 23.

A space S1 is formed in a part surrounded by the main wall 21, the groove bottom portion 22, and the front wall 23.

The height of the cover contact portion 24 is lower than the height of an upper surface 16 of the housing body 11a. A ceiling portion 12a of the front cover 12 comes into contact with the cover contact portion 24 when the housing 11 and the front cover 12 are fixed.

As shown in FIG. 2, the groove portion 20 formed on both side portions of the opening portion 15 includes an inclined portion 25. The inclined portion 25 is provided on the lower part of the housing body 11a. The inclined portion 25 is formed such that the groove bottom portion 22 is inclined from the inside to the outside of the power supply apparatus 1 in the lateral direction, toward the lower part of the housing body 11a.

Rain water or the like on the power supply apparatus 1 flows through the groove portion 20 when, for example, the power supply apparatus 1 is used outdoors. The rain water flowing through the groove portion 20 formed on the upper part of the opening portion 15 flows from the groove portion 20 formed on the upper part of the opening portion 15 to the groove portion 20 formed on the side portion of the opening portion 15. The rain water is further guided to the inclined portion 25, and the rain water flows to the outside of the power supply apparatus 1.

Figure 5:
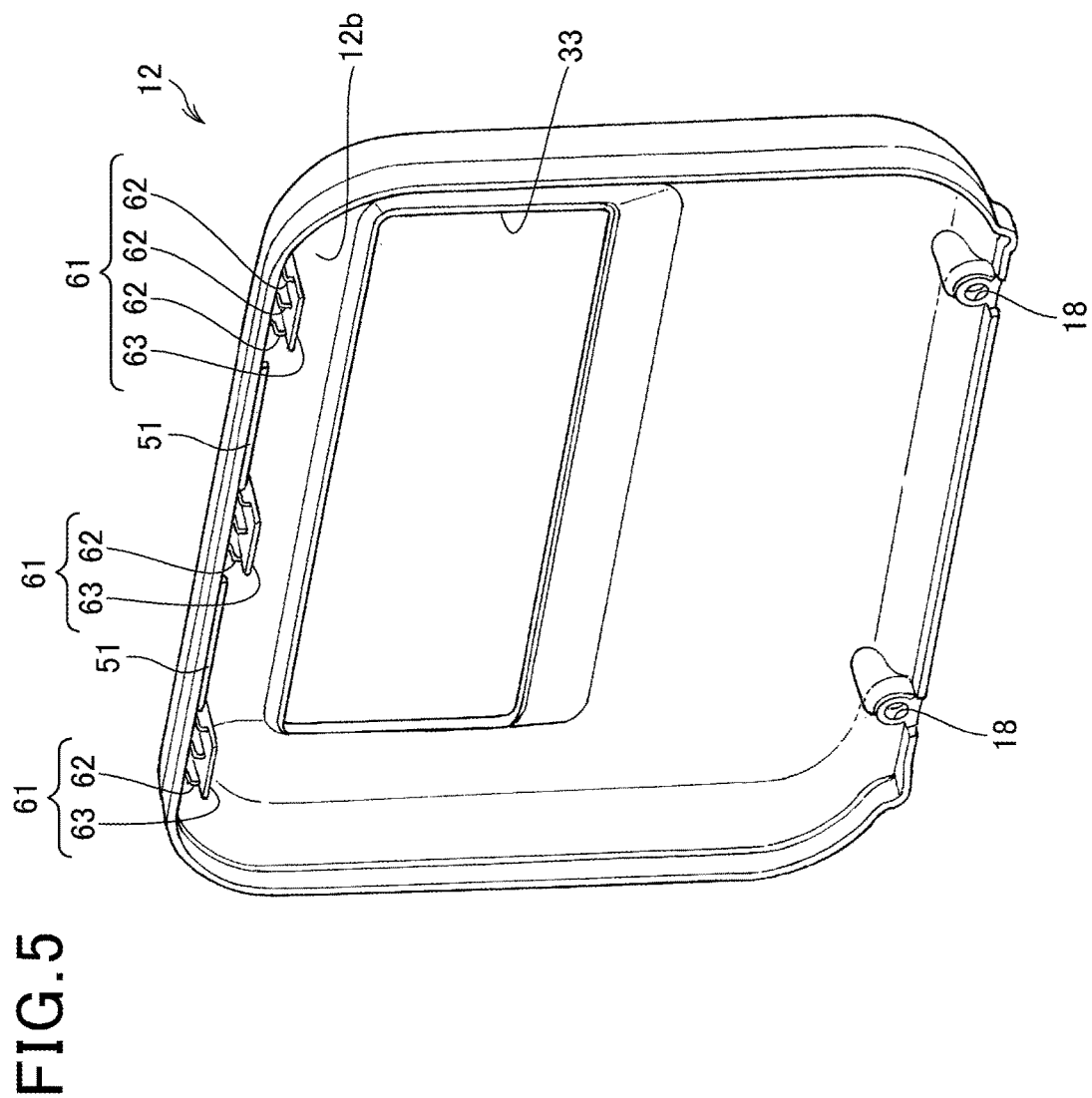
FIG. 5 is a perspective view of the front cover from a back side.
Figure 6:
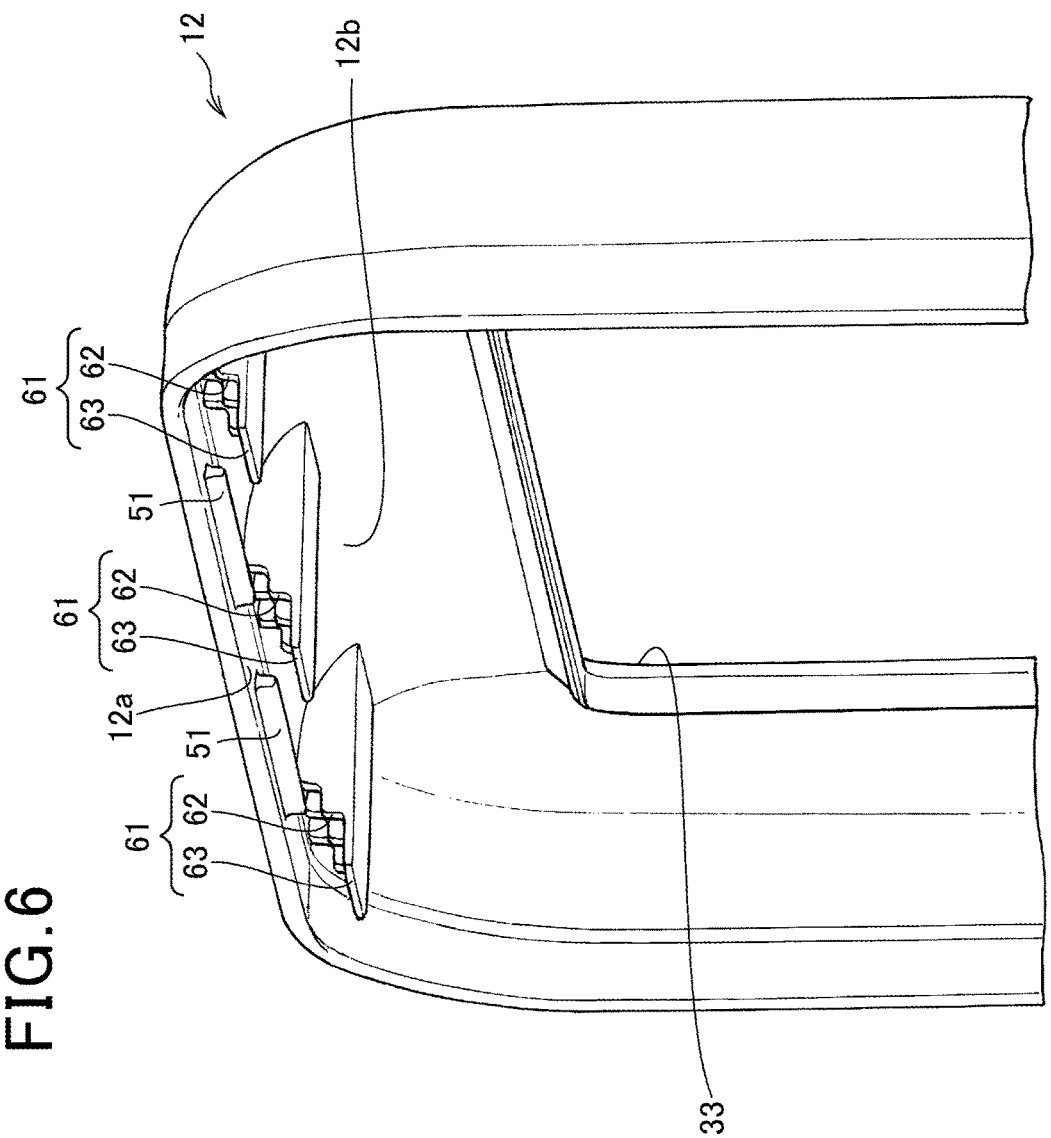
FIG. 6 is a perspective view of the front cover from the back side.

FIGS. 5 and 6 are perspective views of the front cover 12 from the back side.

A panel opening 33 is provided on an upper part of the center of the front cover 12. A panel 34 provided inside of the housing 11 is fitted to the panel opening 33 when the front cover 12 and the housing 11 are fixed. As shown in FIG. 1 or 2, a power supply button 35 and outlet holes 36 are provided on the panel 34.

As shown in FIGS. 5 to 7, the upper part on the back side of the front cover 12 is provided with: first fixing claws 51 inserted into the space S1 of the groove portion 20 when the front cover 12 and the housing 11 are fixed; and second fixing claws 61 that press the front wall 23 of the groove portion 20 from the outside of the groove portion 20.

The first fixing claws 51 extend downward from the ceiling portion 12a of the front cover 12. The first fixing claws 51 have a predetermined width in the lateral direction of the front cover 12.

The second fixing claws 61 are provided from the ceiling portion 12a of the front cover 12 to the back surface of the curved portion 12b. The second fixing claws 61 extend to the back side of the front cover 12.

The second fixing claws 61 include: pressing portions 62 that press the front wall 23 of the groove portion 20 from the outside of the groove portion 20; and support portions 63 that support the groove bottom portion 22 of the groove portion 20 from below.

The pressing portions 62 are positioned on the front side of the first fixing claws 51. An interval S2 at least wider than the thickness of the front wall 23 is provided between the pressing portions 62 and the first fixing claws 51. The front wall 23 is put between the pressing portions 62 and the first fixing claws 51 to fix the front cover 12 and the housing 11. In this case, the first fixing claws 51 and the front wall 23 may be engaged.

Note that the first fixing claws 51 and the second fixing claws 61 that are part of the front cover 12 are formed by a resin.

As shown in FIGS. 5 and 6, the first fixing claws 51 and the second fixing claws 61 are alternately provided in the lateral direction of the front cover 12. The first fixing claws 51 and the second fixing claws 61 are provided at positions not overlapping with each other in the lateral direction of the front cover 12. The front cover 12 in the present embodiment includes five first fixing claws 51 and second fixing claws 61 in total in the order of the second fixing claw 61, the first fixing claw 51, the second fixing claw 61, the first fixing claw 51, and the second fixing claw 61.

Although the first fixing claws 51 and the second fixing claws 61 are physically alternately provided in the lateral direction of the front cover 12 in the present embodiment, the arrangement may not be limited to this embodiment. The alternation can be in any arrangement, such as the second fixing claw 61, the first fixing claw 51, the first fixing claw 51, the second fixing claw 61, the first fixing claw 51, the first fixing claw 51, and the second fixing claw 61, as long as it can be evaluated that the front cover 12 as a whole is provided with the first fixing claws 51 and the second fixing claws 61 alternately arranged in the lateral direction of the front cover 12. In this case, the first fixing claws 51 and the second fixing claws 61 allow stable fixation of the front wall 23 in the front and back direction.

The predetermined width of the first fixing claw 51 in the lateral direction of the front cover 12 can be arbitrarily changed in a range that the first fixing claw 51 does not overlap with the adjacent first fixing claw 51 or second fixing claw 61 in the lateral direction of the front cover 12. For example, the first fixing claw 51 can have a pin shape extending downward from the ceiling portion 12a of the front cover 12.

As shown in FIG. 5, a pair of concave portions 18 are provided on a lower part of the front cover 12. The concave portions 18 are arranged at symmetrical positions, one on the right half and the other on the left half of the front cover 12.

A lower part of the under cover 11b is provided with a pair of convex portions (positioning portions) 19 that can be engaged with the pair of concave portions 18 as shown in FIG. 2. Therefore, the lower part of the opening portion 15 is provided with the pair of convex portions 19. The convex portions 19 are arranged at symmetrical positions, one on the right half and the other on the left half of the under cover 11b.

When the front cover 12 and the housing 11 are to be fixed without using assembly jigs, the convex portions 19 and the concave portions 18 are engaged first, and in this way, the convex portions 19 position the front cover 12 and the housing 11. After the engagement of the convex portions 19 and the concave portions 18, the front wall 23 is put between the first fixing claws 51 and the second fixing claws 61 to fix the front cover 12 and the housing 11.

Therefore, the convex portions 19 have a size in a range that allows rotation of the front cover 12 in fixing the front cover 12 and the housing 11.

The convex portions 19 and the concave portions 18 can have any shape as long as the front cover 12 and the housing 11 can be positioned. Spring materials or the like may be arranged inside of the concave portions 18, and the convex portions 19 and the concave portions 18 may be engaged based on the flexure of the spring materials. Then, the front wall 23 may be put between the first fixing claws 51 and the second fixing claws 61 to fix the front cover 12 and the housing 11.

Next, an action of the present embodiment will be described.

To fix the front cover 12 to the housing 11, the concave portions 18 provided on the front cover 12 are first engaged with the convex portions 19 provided on the under cover 11b to position the front cover 12.

Since the convex portions 19 allow the front cover 12 to rotate, the front cover 12 is rotated to fix the first fixing claws 51 and the second fixing claws 61 provided on the upper part of the front cover 12 to the groove portion 20 of the housing body 11a. More specifically, the front wall 23 is put between the pressing portions 62 included in the second fixing claws 61 and the first fixing claws 51 to fix the front cover 12 and the housing 11. In this case, the first fixing claws 51, the second fixing claws 61, and the front wall 23 can be fixed based on only the flexure of the ceiling portion 12a, the curved portion 12b, the first fixing claws 51, and the second fixing claws 61 formed by a resin. Assembly jigs are not necessary.

As described, in the power supply apparatus 1 according to the present embodiment, the groove portion 20 for drainage is formed on at least the upper part of the opening portion 15 in the housing body 11a (housing), the front cover (cover) 12 that covers the opening portion 15 is arranged on the opening portion 15, and the front cover 12 includes the first fixing claws 51 inserted into the groove portion 20 and the second fixing claws 61 that press the groove portion 20 from the outside.

As a result, the first fixing claws 51 inserted into the groove portion 20 and the second fixing claws 61 that press the groove portion 20 from the outside fix the housing 11 and the front cover 12 through the groove portion 20.

Therefore, the power supply apparatus 1 can be provided in which the housing 11 and the front cover 12 can be easily fixed without using assembly jigs.

Since the groove portion 20 already provided on the housing body 11a is used to fix the front cover 12 to the housing 11, processing is not necessary on the receiving side.

According to the present embodiment, the second fixing claws 61 include the pressing portions 62 that press the groove portion 20 from the outside and the support portions 63 that support the groove portion 20 from below.

As a result, the front wall 23 of the groove portion 20 can be put between the first fixing claws 51 and the pressing portions 62 of the second fixing claws 61 from both sides, and the support portions 63 of the second fixing claws 61 support the groove bottom portion 22 of the groove portion 20. This allows more stable fixation of the front cover 12 to the housing 11.

According to the present embodiment, the total number of the first fixing claws 51 and the second fixing claws 61 is at least three, and the first fixing claws 51 and the second fixing claws 61 are alternately provided and are provided at positions not overlapping with each other.

As a result, the three or more first fixing claws 51 and second fixing claws 61 alternately provided on the front cover 12 allow more stable fixation of the front cover 12 to the housing 11 in the front and back direction. The first fixing claws 51 and the second fixing claws 61 are provided at positions not overlapping with each other, and this facilitates die cutting in the manufacturing of the front cover 12.

According to the present embodiment, the convex portions (positioning portions) 19 that can be engaged with the lower part (concave portions 18) of the front cover 12 are further provided on the lower part of the opening portion 15.

As a result, the convex portions 19 are first engaged with the concave portions 18 to position the front cover 12. Next, the groove portion 20, the first fixing claws 51, and the second fixing claws 61 are fixed on the upper part of the opening portion 15. Since the housing 11 and the front cover 12 can be positioned first on the lower part of the opening portion 15, the front cover 12 can be easily fixed to the housing 11 without using assembly jigs.

According to the present embodiment, one convex portion (positioning portion) 19 is provided on each of the right half and the left half of the under cover (housing) 11b.

As a result, the positioning is further facilitated, and this allows stable fixation of the front cover 12 to the housing 11 without using assembly jigs.

According to the present embodiment, the groove portion 20 is also formed on the side of the housing body (housing) 11a, and the groove portion 20 formed on the side of the housing body 11a includes the inclined portion 25 inclined from the inside to the outside of the groove portion 20.

As a result, the water flowing in the groove portion 20 formed on the upper part of the opening portion 15 flows through the groove portion 20 formed on the side portion of the opening portion 15 continuous with the groove portion 20 formed on the upper part of the opening portion 15. The water is further guided to the inclined portion 25 and naturally led to the outside of the power supply apparatus 1. Therefore, the power supply apparatus 1 can be provided that can use the groove portion 20 formed on the upper part of the opening portion 15 to easily fix the housing 11 and the front cover 12 without using assembly jigs and that can inhibit water from entering the inside of the housing 11.

Although the present invention has been described based on one embodiment, the present invention is not limited to the embodiment. Just one aspect of the present invention is illustrated, and changes and applications can be arbitrarily made without departing from the scope of the present invention.

For example, the first fixing claws 51 and the second fixing claws 61 may be provided on the side portion of the front cover 12. In this case, the first fixing claws 51 and the second fixing claws 61 may be alternately provided in the longitudinal direction and may be provided at positions not overlapping with each other in the longitudinal direction. The first fixing claws 51 and the second fixing claws 61 can be fixed to the groove portion 20 formed on the side portion of the opening portion 15.

Furthermore, it is obvious that the first fixing claws 51 and the second fixing claws 61 may be provided on, for example, the back cover 13.

REFERENCE SIGNS LIST 1 power supply apparatus
11 housing
11a housing body (housing)
11b under cover (housing)
12 front cover (cover)
12a ceiling portion
12b curved portion
13 back cover (cover)
15 opening portion
18 concave portion
19 convex portion (positioning portion)

20 groove portion
21 main wall
22 groove bottom portion
23 front wall
24 cover contact portion
25 inclined portion
51 first fixing claw
61 second fixing claw
62 pressing portion
63 support portion
S1 space
S2 interval

What is claimed is:

1. A power supply apparatus comprising a battery, an inverter and a housing in which the battery and the inverter are housed, wherein a groove portion for drainage is formed on at least an upper part of an opening portion of the housing, the groove portion includes a main wall extending to an inner side of the housing from an upper surface of the housing, a groove bottom portion connected to the main wall and forming a bottom of the groove portion, and a front wall rising up from a front side of the groove bottom portion, which is opposite to the main wall, a space is formed in a part surrounded by the main wall, the groove bottom portion and the front wall, a cover, which covers the opening portion, is arranged on the opening portion, and the cover comprises at least one first fixing claw and at least one second fixing claw, said at least one first fixing claw being inserted into the space of the groove portion and extending toward the groove bottom portion, and said at least one second fixing claw that presses the groove portion from an outside of the groove portion, the at least one second fixing claw includes a pressing portion and a support portion, the pressing portion presses the front wall of the groove portion from the outside of the groove portion so that the front wall is between the pressing portion and the at least one first fixing claw, and the support portion supports the groove bottom portion of the groove portion from below.

2. The power supply apparatus according to claim 1, wherein a total number of the at least one first fixing claws and the at least one second fixing claws is at least three, and the at least three first fixing claws and the at least three second fixing claws are alternately provided and are provided at positions not overlapping with each other.

3. The power supply apparatus according to claim 1, further comprising
a positioning portion that can be engaged with a lower part of the cover, on a lower part of the opening portion.

4. The power supply apparatus according to claim 3, wherein
the positioning portion is provided on at least one part of each of a right half and a left half of the housing.

5. The power supply apparatus according to claim 1, wherein
the groove portion is also formed on a side of the housing, and
the groove portion formed on the side of the housing comprises an inclined portion inclined from an inside to the outside of the groove portion.

6. The power supply apparatus according to claim 2, further comprising
a positioning portion that can be engaged with a lower part of the cover, on a lower part of the opening portion.

7. The power supply apparatus according to claim 2, wherein
the groove portion is also formed on a side of the housing, and
the groove portion formed on the side of the housing comprises an inclined portion inclined from an inside to the outside of the groove portion.

8. The power supply apparatus according to claim 3, wherein
the groove portion is also formed on a side of the housing, and
the groove portion formed on the side of the housing comprises an inclined portion inclined from an inside to the outside of the groove portion.

9. The power supply apparatus according to claim 4, wherein
the groove portion is also formed on a side of the housing, and
the groove portion formed on the side of the housing comprises an inclined portion inclined from an inside to the outside of the groove portion.

10. The power supply apparatus according to claim 1, wherein an interval at least wider than a thickness of the front wall is provided between the pressing portion and the at least one first fixing claw.

11. The power supply apparatus according to claim 1, wherein the groove portion includes a cover contact portion extending to the front side from an upper part of the front wall, an inner surface of the cover comes into contact with an upper surface of the cover contact portion when the housing and the cover are fixed.

12. The power supply apparatus according to claim 1, wherein the pressing portion is provided below the at least one first fixing claw.

* * * * *